United States Patent
Li et al.

(10) Patent No.: US 9,048,461 B2
(45) Date of Patent: Jun. 2, 2015

(54) METHODS OF MANUFACTURING OLED PIXEL AND DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventors: Yujun Li, Shanghai (CN); Zhensheng Lu, Shanghai (CN); Bengang Zhao, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 14/226,795

(22) Filed: Mar. 26, 2014

(65) Prior Publication Data

US 2015/0064818 A1  Mar. 5, 2015

(30) Foreign Application Priority Data

Aug. 29, 2013  (CN) .......................... 2013 1 0385786

(51) Int. Cl.
*H01L 21/00* (2006.01)
*H01L 51/56* (2006.01)
*H01L 27/32* (2006.01)

(52) U.S. Cl.
CPC ............ *H01L 51/56* (2013.01); *H01L 27/3244* (2013.01); *H01L 27/3276* (2013.01)

(58) Field of Classification Search
CPC .. H01L 51/56; H01L 27/3244; H01L 27/3276
USPC .......................................................... 438/28
See application file for complete search history.

(56) References Cited

U.S. PATENT DOCUMENTS

2013/0119857 A1  5/2013  Su et al.
2014/0030833 A1*  1/2014  Sato et al. ...................... 438/34

* cited by examiner

*Primary Examiner* — David S Blum
(74) *Attorney, Agent, or Firm* — Kilpatrick Townsend & Stockton LLP

(57) ABSTRACT

A method of manufacturing an Organic Light Emitting Diode (OLED) pixel is disclosed. The method includes forming an anode and forming a pixel definition layer. The pixel definition layer includes a first sub-pixel area, a second sub-pixel area, a third sub-pixel area corresponding to the third sub-pixel, and a pixel spacing area. The first sub-pixel, the second sub-pixel and the third sub-pixel are separated from each other by the pixel spacing area. The method also includes coating a long-chain fatty acid ester layers on the pixel spacing area, the second sub-pixel area, and the third sub-pixel area, coating light emitting layers on the sub-pixel areas and on the long-chain fatty acid ester layers, and ashing the substrate and removing the long-chain fatty acid ester layers to form light emitting patterns. The method also includes forming a cathode.

14 Claims, 8 Drawing Sheets

23

34

44

METHODS OF MANUFACTURING OLED PIXEL AND DISPLAY DEVICE

CROSS REFERENCE TO RELATED APPLICATIONS

This application claims the benefit of priority to Chinese Patent Application No. 201310385786.9, filed with the Chinese Patent Office on Aug. 29, 2013 and entitled "METHODS OF MANUFACTURING OLED PIXEL AND DISPLAY DEVICE", the content of which is incorporated herein by reference in its entirety.

TECHNICAL FIELD

The present invention relates to the field of display, and particularly to a method of manufacturing an OLED (organic light emitting diode) pixel and a method of manufacturing an OLED display device.

BACKGROUND OF THE INVENTION

At present, OLED display devices serving as active light emitting devices receive more and more attention, and the manufacturing technology of the OLED display devices is gradually mature. Generally, an OLED pixel is mainly manufactured through the following three steps: forming a TFT (thin film transistor) circuit and an OLED anode on an OLED substrate; forming an OLED light emitting layer; and depositing a film to form an OLED cathode, wherein the OLED light emitting layer is formed generally by evaporation, but the evaporation has the following problems:

1. because the sublimation temperature of an OLED light emitting material is very high, a mask is easily deformed during evaporation, and the fineness of a device structure cannot reach the standard;
2. large-area production cannot be realized, otherwise, the center of the mask droops;
3. non-uniformity of film thickness is easily caused by non-uniform evaporation;
4. if the OLED light emitting layer is formed by printing, the problems of non-uniformity display, low light emitting efficiency and the like are caused due to the characteristic of material whose granules are thick in the middle and thin in the edge; and
5. if the OLED light emitting layer is formed with a silk-screen printing process, the problems that displaying is non-uniform and the light emitting layer is thick in the middle and thin in the edge exist likewise.

Moreover, the above process still has the following problems which cannot be solved at present:

1. R(red)G(green)B(blue) full-color film formation cannot be realized, as the OLED light emitting layer is forbidden to be exposed and cannot contact H2O or O2 and thus cannot be etched;
2. in order to achieve a full-color display effect, a blended color filter needs to be added, but in this case, a display device is very thick in overall size, complex in process and low in light utilization rate; and
3. valuable OLED light emitting materials are wasted.

BRIEF SUMMARY OF THE INVENTION

One inventive aspect is a method of manufacturing an Organic Light Emitting Diode (OLED) pixel, where the OLED pixel at least includes a first sub-pixel, a second sub-pixel and a third sub-pixel. The method includes forming an anode on a substrate, forming a pixel definition layer on the substrate, where the pixel definition layer includes a first sub-pixel area corresponding to the first sub-pixel, a second sub-pixel area corresponding to the second sub-pixel, a third sub-pixel area corresponding to the third sub-pixel, and a pixel spacing area. The first sub-pixel, the second sub-pixel and the third sub-pixel are separated from each other by the pixel spacing area. The method also includes coating a first long-chain fatty acid ester layer on the pixel spacing area, the second sub-pixel area, and the third sub-pixel area, coating a first light emitting layer on the first sub-pixel area and on the first long-chain fatty acid ester layer, and ashing the substrate and removing the first long-chain fatty acid ester layer to form a first light emitting pattern. The method also includes coating a second long-chain fatty acid ester layer on the pixel spacing area, the first light emitting pattern, and the third sub-pixel area, coating a second light emitting layer on the second sub-pixel area and the second long-chain fatty acid ester layer, and ashing the substrate and removing the second long-chain fatty acid ester layer to form a second light emitting pattern. The method also includes coating a third long-chain fatty acid ester layer on the pixel spacing area, the first light emitting pattern, and the second light emitting pattern, coating a third light emitting layer on the third sub-pixel area and the third long-chain fatty acid ester layer, and ashing the substrate and removing the third long-chain fatty acid ester layer to form a third light emitting pattern, and forming a cathode.

Another inventive aspect is a method of manufacturing an OLED display device. The method includes forming multiple OLED pixels on a first substrate, and adhering the first substrate to a second substrate through a frit to form the OLED display device. Each OLED pixel includes a first sub-pixel, a second sub-pixel, and a third sub-pixel. Forming the multiple OLED pixels on the first substrate includes forming an anode and a pixel definition layer on the first substrate, where the pixel definition layer includes multiple first sub-pixel areas corresponding to the first sub-pixels, multiple second sub-pixel areas corresponding to the second sub-pixels, multiple third sub-pixel areas corresponding to the third sub-pixels, and a pixel spacing area. The first sub-pixels, the second sub-pixels and the third sub-pixels are separated from each other by the pixel spacing area. Forming the multiple OLED pixels also includes coating a first long-chain fatty acid ester layer on the pixel spacing area, the second sub-pixel areas, and the third sub-pixel areas, coating a first light emitting layer on the first sub-pixel areas and the first long-chain fatty acid ester layer, and ashing the first substrate and removing the first long-chain fatty acid ester layer to form first light emitting patterns. Forming the multiple OLED pixels also includes coating a second long-chain fatty acid ester layer on the pixel spacing area, the first light emitting patterns, and the third sub-pixel areas, coating a second light emitting layer on the second sub-pixel areas and the second long-chain fatty acid ester layer, and ashing the first substrate and removing the second long-chain fatty acid ester layer to form second light emitting patterns. Forming the multiple OLED pixels also includes coating a third long-chain fatty acid ester layer on the pixel spacing area, the first light emitting patterns, and the second light emitting patterns, coating a third light emitting layer on the third sub-pixel areas and the third long-chain fatty acid ester layer, and ashing the first substrate and removing the third long-chain fatty acid ester layer to form third light emitting patterns, and forming a cathode.

DETAILED DESCRIPTION OF THE PREFERRED EMBODIMENTS

To make the above-mentioned objectives, characteristics and advantages of the invention more obvious and easy to understand, specific embodiments of the invention are described in detail below in conjunction with the accompanying drawings.

Many specific details are illustrated in the following descriptions to fully understand the invention, but the invention may also be implemented in other modes different from those described herein, thus the invention is not limited by the following disclosed specific embodiments.

An Embodiment

Figure 1:
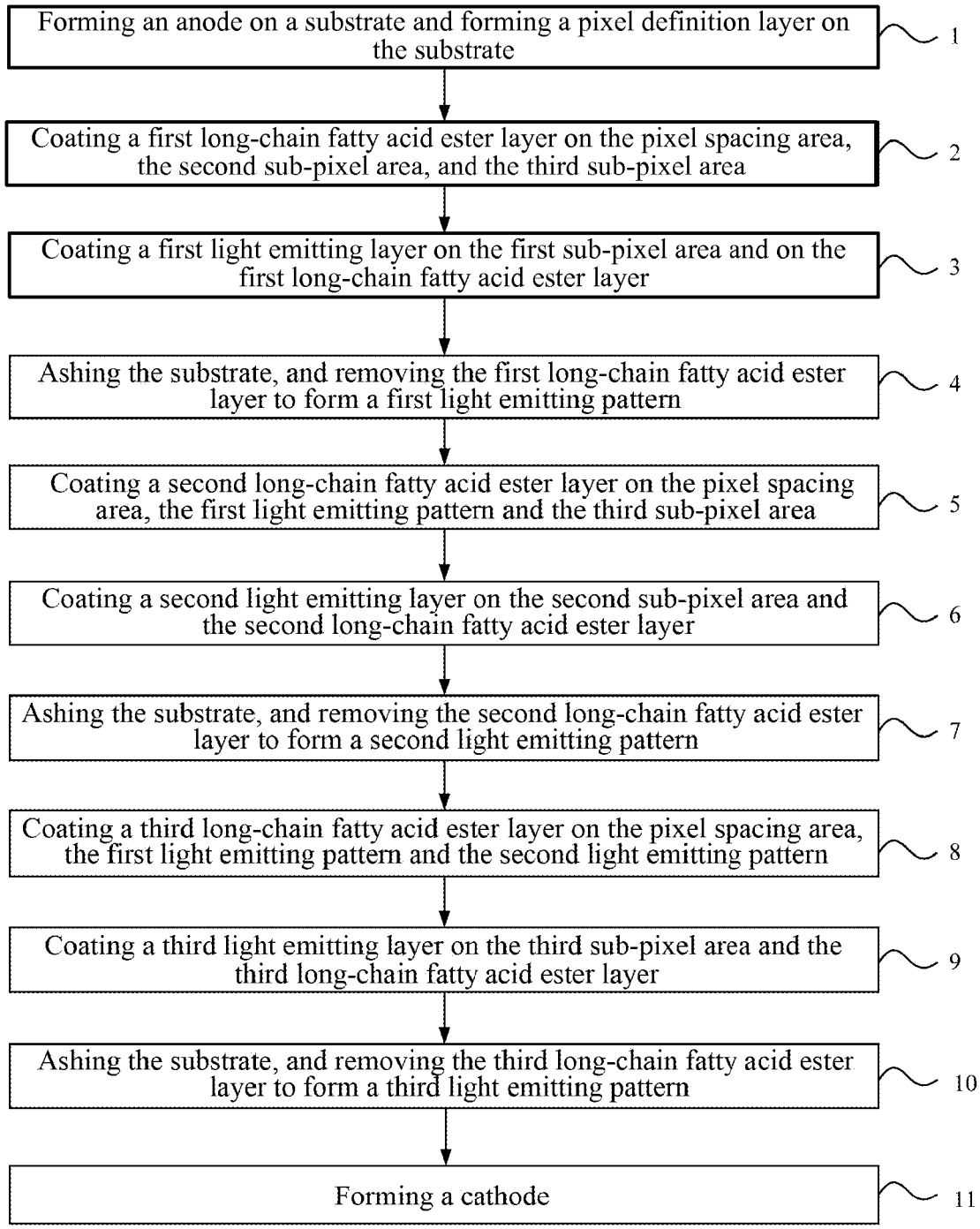
FIG. 1 is a flow chart of a method of manufacturing an OLED pixel in an embodiment.
Figure 2:
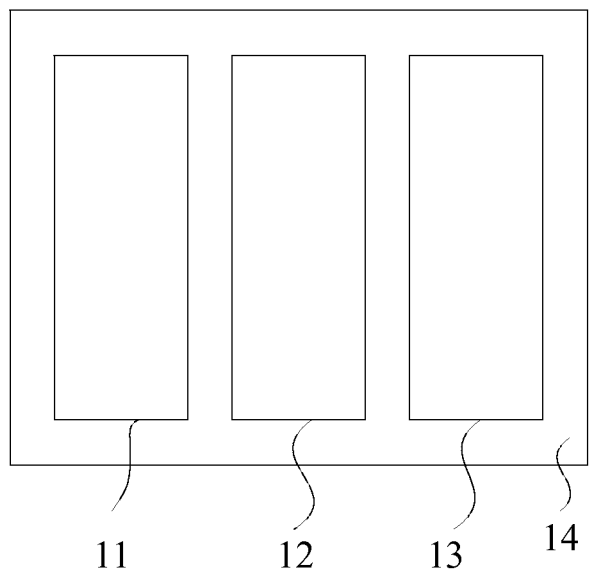
FIG. 2 to FIG. 11 are schematic diagrams of substrates obtained by adopting the method in the embodiment.

This embodiment provides a method of manufacturing an OLED pixel, wherein the OLED pixel at least includes a first sub-pixel, a second sub-pixel and a third sub-pixel, and generally, the first sub-pixel, the second sub-pixel and the third sub-pixel respectively correspond to light emitting layers of three colors, namely R (red), G (green) and B (blue), to realize full-color display. As shown in FIG. 1, the method of manufacturing the OLED pixel includes:

Step 1: forming an anode on a substrate and forming a pixel definition layer on the substrate, as shown in FIG. 2. The pixel definition layer includes a first sub-pixel area 11 corresponding to the first sub-pixel, a second sub-pixel area 12 corresponding to the second sub-pixel, a third sub-pixel area 13 corresponding to the third sub-pixel and a pixel spacing area 14, and the first sub-pixel, the second sub-pixel and the third sub-pixel are separated from each other by the pixel spacing area 14, namely any two sub-pixels are separated from each other by the pixel spacing area 14.

Figure 3:
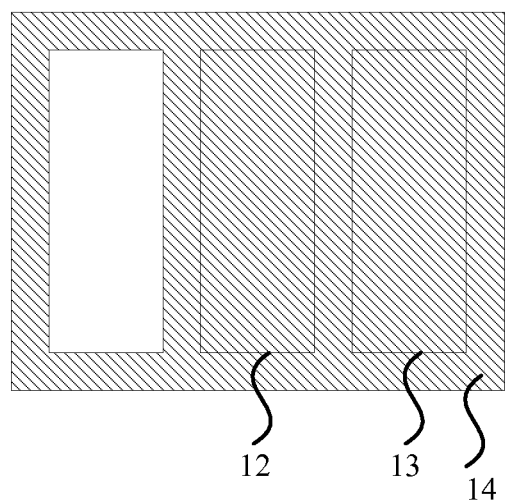

Step 2: coating a first long-chain fatty acid ester layer on the pixel spacing area 14, the second sub-pixel area 12, and the third sub-pixel area 13, as shown in FIG. 3. Preferably, the first long-chain fatty acid ester layer may be coated with a silk-screen printing process.

Figure 4:
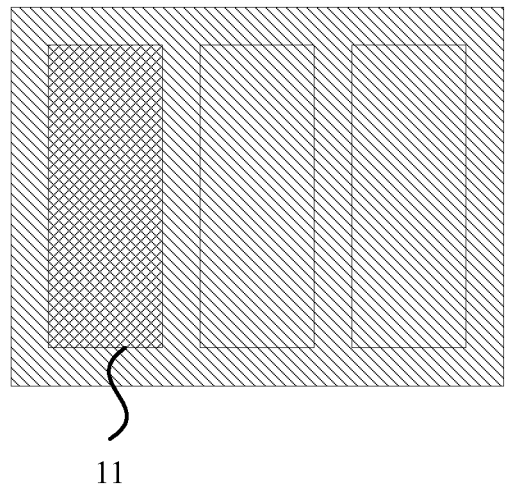

Step 3: coating a first light emitting layer on the first sub-pixel area 11 and on the first long-chain fatty acid ester layer, as shown in FIG. 4. The first light emitting layer is made of an organic matter, and the first long-chain fatty acid ester layer is made of an organic matter formed by long-chain fatty acid ester molecules, therefore, the two organic matters do not infiltrate each other, so the material of the first light emitting layer cannot be coated on the surface where the long-chain fatty acid ester has been coated, and the first light emitting layer can be merely formed in the first sub-pixel area 11 which is not covered by the first long-chain fatty acid ester layer. Preferably, the first light emitting layer is coated with a spin coating process.

Figure 5:
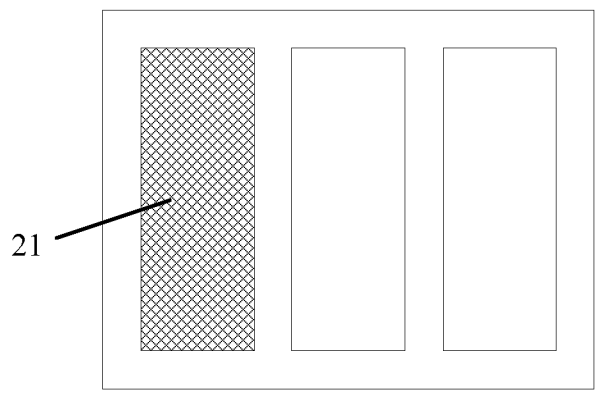

Step 4: ashing the substrate, and removing the first long-chain fatty acid ester layer to form a first light emitting pattern 21, as shown in FIG. 5. Ashing herein is implemented preferably by adopting argon or oxide or a mixed gas of argon and oxide in a plasma ashing mode.

Figure 6:
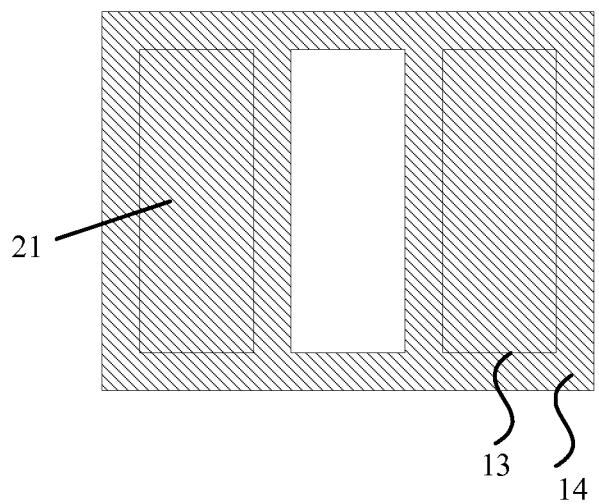

Step 5: coating a second long-chain fatty acid ester layer on the pixel spacing area 14, the first light emitting pattern 21 and the third sub-pixel area 13, as shown in FIG. 6. It should be noted that the characteristic of non infiltration between the first light emitting layer and the long-chain fatty acid ester mainly presents when the first light emitting layer is in a wet state, and after the first light emitting layer is dried by blowing for a certain period of time or in other condition, the characteristic of non infiltration between the later formed first light emitting pattern 21 and the long-chain fatty acid ester does not present any more, so the second long-chain fatty acid ester layer can be coated on the dried first light emitting pattern 21. Preferably, the second long-chain fatty acid ester layer may be coated with a silk-screen printing process.

Figure 7:
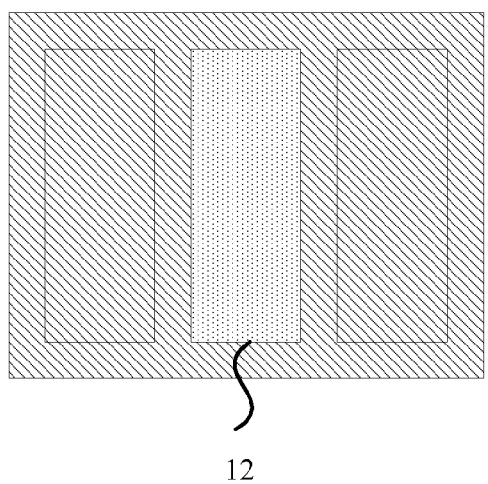

Step 6: coating a second light emitting layer on the second sub-pixel area 12 and the second long-chain fatty acid ester layer, as shown in FIG. 7. Preferably, the second light emitting layer is coated with a spin coating process. The second light emitting layer can be merely formed in the second sub-pixel area 12.

Figure 8:
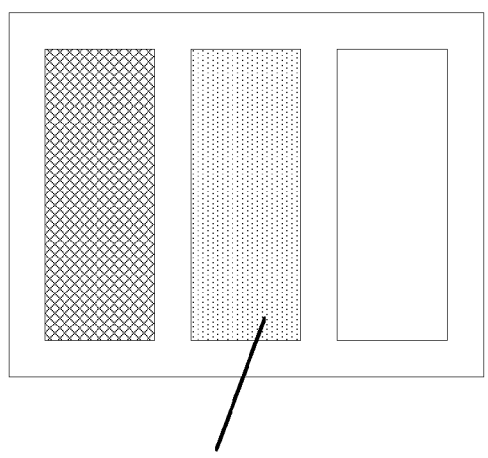

Step 7: ashing the substrate, and removing the second long-chain fatty acid ester layer to form a second light emitting pattern 22, as shown in FIG. 8. For ashing herein, reference may be made to the treatment mode in step 4, which is not described redundantly herein.

Figure 9:
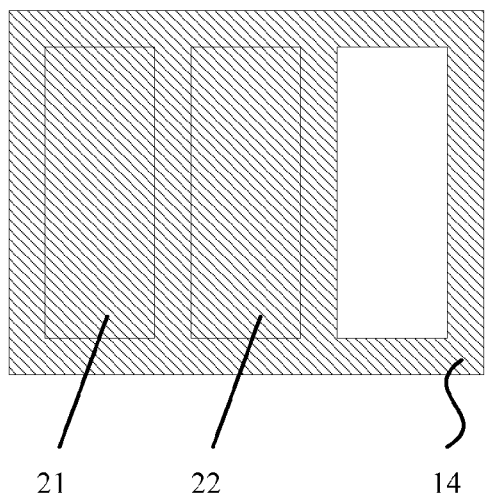

Step 8: coating a third long-chain fatty acid ester layer on the pixel spacing area 14, the first light emitting pattern 21 and the second light emitting pattern 22, as shown in FIG. 9. Preferably, the third long-chain fatty acid ester layer is coated with a silk-screen printing process.

Figure 10:
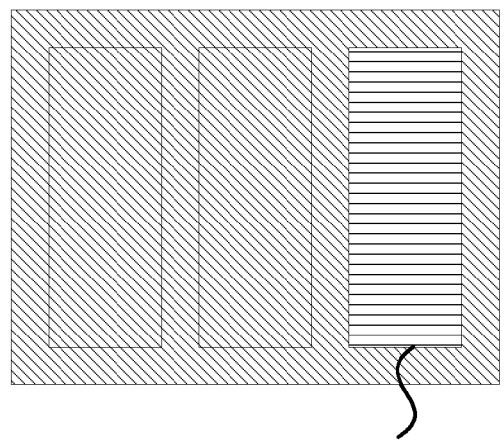

Step 9: coating a third light emitting layer on the third sub-pixel area 13 and the third long-chain fatty acid ester layer, as shown in FIG. 10. Preferably, the third light emitting layer is coated with a spin coating process. The third light emitting layer can be still merely formed in the third sub-pixel area 13.

Figure 11:
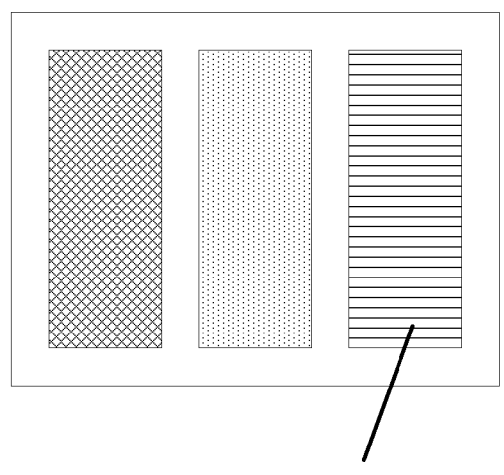

Step 10: ashing the substrate, and removing the third long-chain fatty acid ester layer to form a third light emitting pattern 23, as shown in FIG. 11. For ashing herein, reference may be made to the treatment in step 4, which is not described redundantly herein.

Step 11: forming a cathode.

It should be noted that in this embodiment, step 1 of forming the anode and the pixel definition layer on the substrate and step 11 of forming the cathode may be implemented with reference to the prior art, so step 1 and step 11 are not specifically described in this embodiment and may be implemented by those skilled in the art according to the experience in this field. For example, before the step of forming the anode on the substrate, the method may further include a step of cleaning the substrate, a step of forming TFTs on the substrate, or other alternative steps.

The OLED light emitting layers are prevented from being formed by using the traditional evaporation method in this embodiment, so that various aforementioned disadvantages caused by evaporation are avoided, and full-color display of the OLED pixel is also realized; and a blended color filter is not needed, so that the defects that the overall size of a display device is too thick and the like are overcome.

Figure 12:
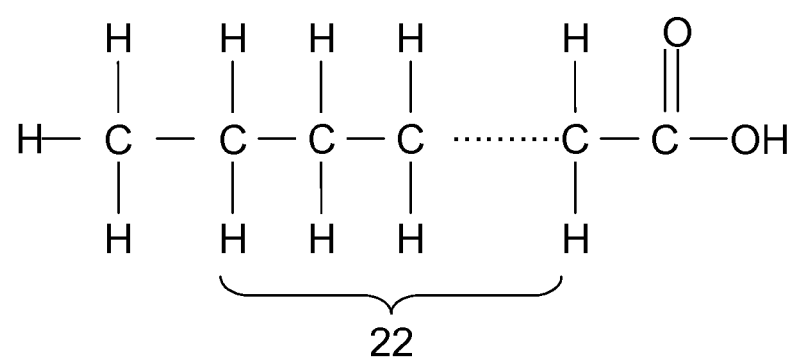
FIG. 12 is a molecular formula of a long-chain fatty acid in the embodiment.

Preferably, the first long-chain fatty acid ester or the second long-chain fatty acid ester or the third long-chain fatty acid ester can be $CH_3(CH_2)_{22}COOH$ which has a molecular formula as shown in FIG. 12. Certainly, the first long-chain fatty acid ester or the second long-chain fatty acid ester or the third long-chain fatty acid ester is not limited to the lignoceric acid herein, and may be other long-chain fatty acid ester or another acid ester.

Preferably, the thickness of, the first long-chain fatty acid ester layer or the second long-chain fatty acid ester layer or the third long-chain fatty acid ester layer, may be 10 Å.

Preferably, the first light emitting layer is a red (R) light emitting layer, the second light emitting layer is a green (G) light emitting layer, the third light emitting layer is a blue (B) light emitting layer, and full-color film formation of RGB three colors may be realized in this case. The thickness of, the first light emitting layer or the second light emitting layer or the third light emitting layer, can be 100 Å to 1000 Å. Under different conditions, a certain thickness of film may be formed according to actual needs, which is not specifically limited herein. Certainly, the first light emitting layer, the second light emitting layer and the third light emitting layer may not strictly correspond to the red, green and blue light emitting layers respectively, but only need to correspond to a different one of the light emitting layers of RGB three colors respectively.

Preferably, the thickness of the red light emitting layer can be 410 Å, the thickness of the blue light emitting layer or the green light emitting layer can be 390 Å to 400 Å, and in this case, after the following plasma ashing treatment, the thickness of the obtained red light emitting pattern is 400 Å, and the thickness of the green light emitting pattern or blue light emitting pattern is 380 Å to 390 Å.

It should be noted that the first sub-pixel, the second sub-pixel and the third sub-pixel are not limited in shape, arrangement mode and the like in this embodiment, and may be oblong as shown in FIG. 2 to FIG. 11 or in other regular geometrical shapes such as square, triangle, trapezoid or circle or in irregular shapes; and similarly, the first sub-pixel, the second sub-pixel and the third sub-pixel may be arranged in parallel as shown in FIG. 2 to FIG. 11 or arranged staggered, for example, in the form of honeycomb and the like, and the arrangement mode is neither limited herein.

Preferably, before coating the second long-chain fatty acid ester layer in step 5 or coating the third long-chain fatty acid ester layer in step 8, a step of baking or heating the substrate may be further included in the method. Through the step of baking or heating the substrate, the first light emitting pattern or the second light emitting pattern may be further dried or cured, so that the second long-chain fatty acid ester layer can be better coated on the first light emitting pattern later, or the third long-chain fatty acid ester layer can be better coated on the second light emitting pattern.

Another Embodiment

Figure 13:
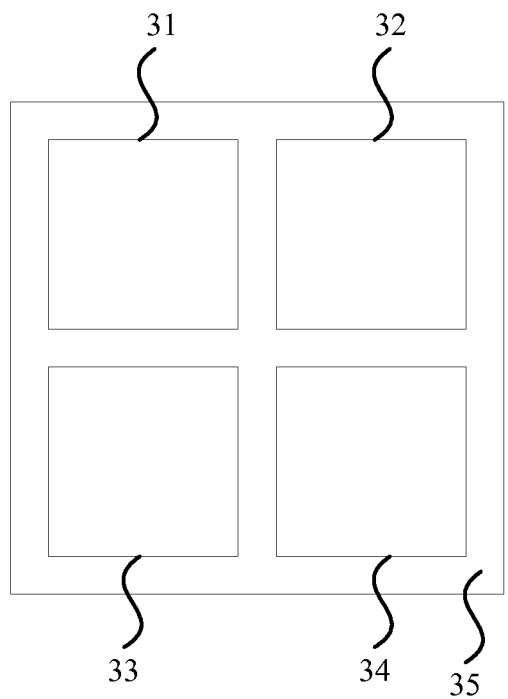
FIG. 13 to FIG. 16 are schematic diagrams of substrates obtained by adopting a method in another embodiment.

This embodiment is formed on the basis of the foregoing embodiment. Different from the foregoing embodiment, in this embodiment, as shown in FIG. 13, the OLED pixel also includes a fourth sub-pixel besides the first sub-pixel, the second sub-pixel and the third sub-pixel in the foregoing embodiment; and correspondingly, the pixel definition layer also includes a fourth sub-pixel area 34 corresponding to the fourth sub-pixel besides a first sub-pixel area 31 corresponding to the first sub-pixel, a second sub-pixel area 32 corresponding to the second sub-pixel, a third sub-pixel area 33 corresponding to the third sub-pixel and a pixel spacing area 35, and the fourth sub-pixel is separated from the first sub-pixel, the second sub-pixel and the third sub-pixel by the pixel spacing area 35, that is, any two sub-pixels are separated from each other by the pixel spacing area 35.

Figure 14:
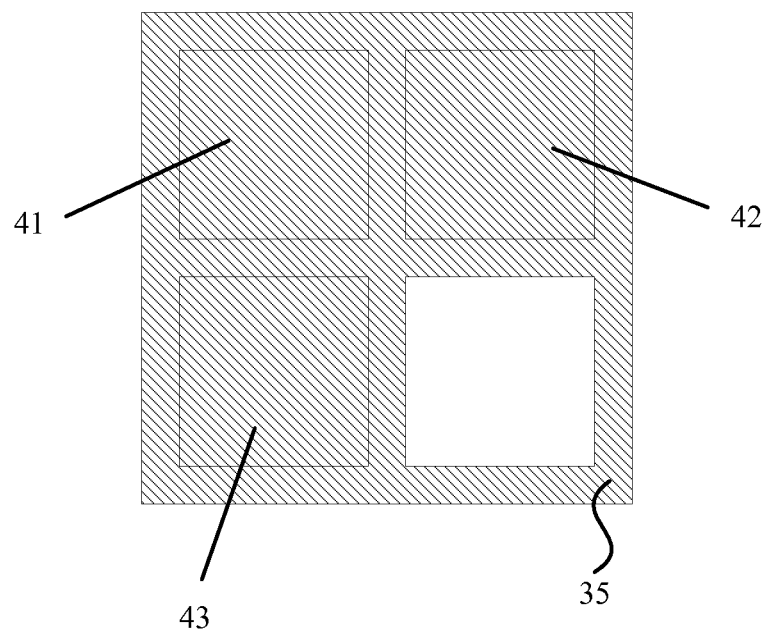

A method of manufacturing an OLED pixel further includes the following steps after the step of forming the third light emitting pattern and before the step of forming the cathode besides the steps 1 to 11 in the foregoing embodiment:

Step 101: coating a fourth long-chain fatty acid ester layer on the pixel spacing area 35, the first light emitting pattern 41, the second light emitting pattern 42 and the third light emitting pattern 43, as shown in FIG. 14. Preferably, the fourth long-chain fatty acid ester layer is coated with a silk-screen printing process.

Figure 15:
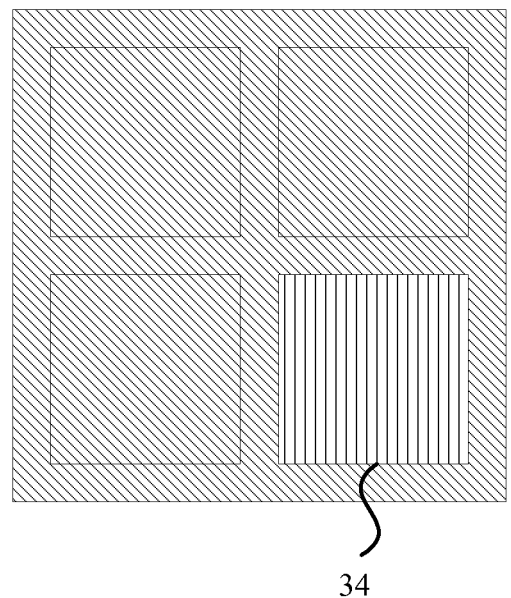

Step 102: coating a fourth light emitting layer on the fourth sub-pixel area 34 and the fourth long-chain fatty acid ester layer, as shown in FIG. 15. Preferably, the fourth light emitting layer is coated with a spin coating process. The fourth light emitting layer can be merely formed in the fourth sub-pixel area 34.

Figure 16:
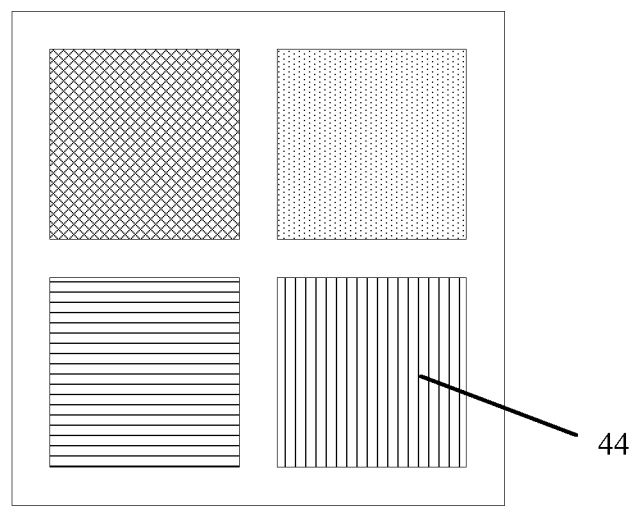

Step 103: ashing the substrate, and removing the fourth long-chain fatty acid ester layer to form a fourth light emitting pattern 44, as shown in FIG. 16. For ashing herein, reference may be made to the treatment of step 4 in the foregoing embodiment, which is not described redundantly herein.

This embodiment discloses a method of manufacturing the OLED pixel including four sub-pixels. The manufacturing way of each sub-pixel is similar to that of each sub-pixel given in the foregoing embodiment, then reference may be made to the foregoing embodiment, and the quantity of the sub-pixels in this embodiment is different from that in the foregoing embodiment. One sub-pixel is added in the OLED pixel of this embodiment, so that the color range displayed by the OLED pixel can be wider.

Similarly, any limitation is not made to the shape and specific arrangement mode of the first sub-pixel, the second sub-pixel, the third sub-pixel and the fourth sub-pixel in the embodiment, an example that each sub-pixel is square and the sub-pixels are arranged in a matrix form is given merely for illustrating in FIG. 13 to FIG. 16, and the actual arrangement mode or shape is designed according to needs.

In addition, the first sub-pixel, the second sub-pixel, the third sub-pixel and the fourth sub-pixel herein may be sub-pixels of a same color, or sub-pixels of different colors, or sub-pixels of which part have a same color and the other part have different colors, which is not specifically limited herein. Preferably, under the condition that the OLED pixel includes two or more sub-pixels with a same color, the two or more sub-pixels with the same color may be formed together in one step (namely the two or more areas corresponding to the sub-pixels are coated together in the step of coating some light emitting layer), to simplify the whole process flow.

Preferably, the fourth long-chain fatty acid ester can be $CH_3(CH_2)_{22}COOH$, or the thickness of the fourth long-chain fatty acid ester layer can be 10 Å, or the thickness of the fourth light emitting layer can be 100 Å to 1000 Å. This is similar to the foregoing embodiment and is not described redundantly herein, and reference is made to the foregoing embodiment.

Preferably, the fourth light emitting layer can be any one of red, green, blue, yellow or white light emitting layers and may also be a blended light emitting layer mixed by several different color's light emitting layers, which is not limited herein.

Another Embodiment

Figure 17:
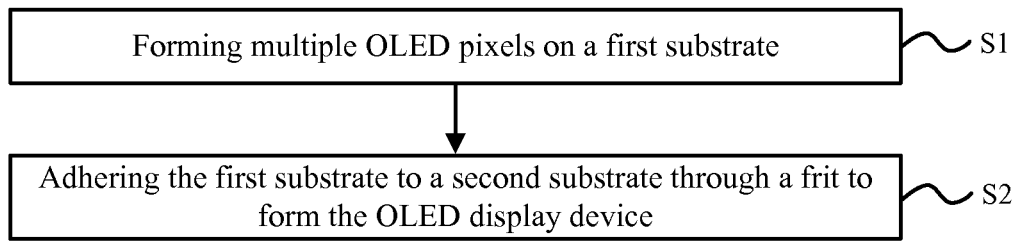
FIG. 17 is a flow chart of a method of manufacturing an OLED display device in another embodiment.

This embodiment provides a method of manufacturing an OLED display device, wherein the OLED display device includes multiple OLED pixels manufactured by using the method of any above-mentioned embodiments. Each OLED pixel at least includes a first sub-pixel, a second sub-pixel and a third sub-pixel. Specifically, as shown in FIG. 17, the method of manufacturing the OLED display device includes:

Step S1: forming multiple OLED pixels on a first substrate, specifically including:

Step S101: forming an anode and a pixel definition layer on the first substrate, wherein the pixel definition layer includes multiple first sub-pixel areas corresponding to the first sub-pixels, multiple second sub-pixel areas corresponding to the second sub-pixels, multiple third sub-pixel areas corresponding to the third sub-pixels and a pixel spacing area, and the first sub-pixels, the second sub-pixels and the third sub-pixels are separated from each other by the pixel spacing area;

Step S102: coating a first long-chain fatty acid ester layer on the pixel spacing area, the second sub-pixel areas and the third sub-pixel areas;

Step S103: coating a first light emitting layer on the first sub-pixel areas and the first long-chain fatty acid ester layer;

Step S104: ashing the first substrate, and removing the first long-chain fatty acid ester layer to form first light emitting patterns;

Step S105: coating a second long-chain fatty acid ester layer on the pixel spacing area, the first light emitting patterns and the third sub-pixel areas;

Step S106: coating a second light emitting layer on the second sub-pixel areas and the second long-chain fatty acid ester layer;

Step S107: ashing the first substrate, and removing the second long-chain fatty acid ester layer to form second light emitting patterns;

Step S108: coating a third long-chain fatty acid ester layer on the pixel spacing area, the first light emitting patterns and the second light emitting patterns;

Step S109: coating a third light emitting layer on the third sub-pixel areas and the third long-chain fatty acid ester layer;

Step S110: ashing the first substrate, and removing the third long-chain fatty acid ester layer to form third light emitting patterns;

Step S111: forming a cathode.

The implementation of step S1 is similar to the steps provided in the foregoing embodiments, and reference is made to the contents in the foregoing embodiments, which are not described redundantly herein.

Step S2: adhering the first substrate to a second substrate through a frit to form the OLED display device;

Generally, the frit is melted under irradiating of laser to paste the first substrate and the second substrate and the two substrates are packaged after cooling of the frit, thus the OLED display device is manufactured.

As a variation of this embodiment, each OLED pixel included in the OLED display device may include four sub-pixels, the manufacturing method of the OLED display device is only needs to replace the above steps of manufacturing the OLED pixel including three sub-pixels provided in step S1 of this embodiment with the steps of manufacturing the OLED pixel including four sub-pixels provided in the foregoing embodiment, and other steps are almost the same and are not described redundantly herein.

By adopting the method of manufacturing the OLED display device provided in this embodiment, defects caused by manufacturing the OLED device by traditional evaporation are overcome. What's more, RGB full-color film formation may be realized, and the display effect is better.

It should be noted that the above embodiments may be used for reference to each other and comprehensively utilized. Preferred embodiments have been disclosed above, rather than limiting the invention. Possible variations and modifications could be made to the technical solutions of the invention through using the above disclosed methods and technical contents by those skilled in the art without departing from the essence and scope of the invention. Accordingly, any simple modifications and equivalent variations made to the above embodiments according to the technical essence of the invention without departing from the contents of the technical solutions of the invention should be within the protection scope of the technical solutions of the invention.

What is claimed is:

1. A method of manufacturing an Organic Light Emitting Diode (OLED) pixel, wherein the OLED pixel at least comprises a first sub-pixel, a second sub-pixel and a third sub-pixel, wherein the method of manufacturing the OLED pixel comprises:

forming an anode on a substrate;

forming a pixel definition layer on the substrate, wherein the pixel definition layer comprises:
 a first sub-pixel area corresponding to the first sub-pixel,
 a second sub-pixel area corresponding to the second sub-pixel,
 a third sub-pixel area corresponding to the third sub-pixel, and
 a pixel spacing area,
 wherein the first sub-pixel, the second sub-pixel and the third sub-pixel are separated from each other by the pixel spacing area;

coating a first long-chain fatty acid ester layer on the pixel spacing area, the second sub-pixel area, and the third sub-pixel area;

coating a first light emitting layer on the first sub-pixel area and on the first long-chain fatty acid ester layer;

ashing the substrate, and removing the first long-chain fatty acid ester layer to form a first light emitting pattern;

coating a second long-chain fatty acid ester layer on the pixel spacing area, the first light emitting pattern, and the third sub-pixel area;

coating a second light emitting layer on the second sub-pixel area and the second long-chain fatty acid ester layer;

ashing the substrate, and removing the second long-chain fatty acid ester layer to form a second light emitting pattern;

coating a third long-chain fatty acid ester layer on the pixel spacing area, the first light emitting pattern, and the second light emitting pattern;

coating a third light emitting layer on the third sub-pixel area and the third long-chain fatty acid ester layer;

ashing the substrate, and removing the third long-chain fatty acid ester layer to form a third light emitting pattern; and forming a cathode.

2. The method of claim 1, wherein the first long-chain fatty acid ester or the second long-chain fatty acid ester or the third long-chain fatty acid ester is CH3(CH2)22COOH.

3. The method of claim 1, wherein at least one of the first long-chain fatty acid ester layer, the second long-chain fatty acid ester layer, and the third long-chain fatty acid ester layer is coated with a silk-screen printing process.

4. The method of claim 1, wherein at least one of the first light emitting layer, the second light emitting layer, and the third light emitting layer is coated with a spin coating process.

5. The method of claim 1, wherein a thickness of at least one of the first long-chain fatty acid ester layer, the second long-chain fatty acid ester layer, and third long-chain fatty acid ester layer is 10 Å.

6. The method of claim 1, wherein the first light emitting layer is a red light emitting layer, the second light emitting layer is a green light emitting layer, and the third light emitting layer is a blue light emitting layer.

7. The method of claim 6, wherein a thickness of at least one of the first light emitting layer, the second light emitting layer, and the third light emitting layer is 100 Å to 1000 Å.

8. The method of claim 7, wherein a thickness of the red light emitting layer is 410 Å, and a thickness of at least one of the blue light emitting layer and the green light emitting layer is 390 Å to 400 Å.

9. The method of claim 1, wherein the method further comprises at least one of:
   a) before coating the second long-chain fatty acid ester layer, baking the substrate, and
   b) before coating the third long-chain fatty acid ester layer, baking the substrate.

10. The method of claim 1, wherein the OLED pixel further comprises a fourth sub-pixel, the pixel definition layer further comprises a fourth sub-pixel area corresponding to the fourth sub-pixel, and the fourth sub-pixel is separated from the first sub-pixel, the second sub-pixel and the third sub-pixel by the pixel spacing area, and
   wherein, after forming the third light emitting pattern and before forming the cathode, the method of manufacturing the OLED pixel further comprises:
      coating a fourth long-chain fatty acid ester layer on the pixel spacing area, the first light emitting pattern, the second light emitting pattern, and the third light emitting pattern;
      coating a fourth light emitting layer on the fourth sub-pixel area and the fourth long-chain fatty acid ester layer; and
      ashing the substrate, and removing the fourth long-chain fatty acid ester layer to form a fourth light emitting pattern.

11. The method of claim 10, wherein the fourth long-chain fatty acid ester is $CH_3(CH_2)_{22}COOH$, or a thickness of the fourth long-chain fatty acid ester layer is 10 Å, or a thickness of the fourth light emitting layer is 100 Å to 1000 Å.

12. The method of claim 10, wherein the fourth long-chain fatty acid ester layer is coated with a silk-screen printing process, and the fourth light emitting layer is coated using a spin coating process.

13. The method of claim 10, wherein the fourth light emitting layer is any one of red, green, blue, yellow, and white light emitting layers.

14. A method of manufacturing an OLED display device, the method comprising:
   forming multiple OLED pixels on a first substrate; and
   adhering the first substrate to a second substrate through a frit to form the OLED display device,
   wherein each OLED pixel comprises:
      a first sub-pixel,
      a second sub-pixel, and
      a third sub-pixel, and
   wherein forming the multiple OLED pixels on the first substrate comprises:
      forming an anode and a pixel definition layer on the first substrate, wherein the pixel definition layer comprises:
         multiple first sub-pixel areas corresponding to the first sub-pixels,
         multiple second sub-pixel areas corresponding to the second sub-pixels,
         multiple third sub-pixel areas corresponding to the third sub-pixels, and
         a pixel spacing area,
         wherein the first sub-pixels, the second sub-pixels and the third sub-pixels are separated from each other by the pixel spacing area;
      coating a first long-chain fatty acid ester layer on the pixel spacing area, the second sub-pixel areas, and the third sub-pixel areas;
      coating a first light emitting layer on the first sub-pixel areas and the first long-chain fatty acid ester layer;
      ashing the first substrate, and removing the first long-chain fatty acid ester layer to form first light emitting patterns;
      coating a second long-chain fatty acid ester layer on the pixel spacing area, the first light emitting patterns, and the third sub-pixel areas;
      coating a second light emitting layer on the second sub-pixel areas and the second long-chain fatty acid ester layer;
      ashing the first substrate, and removing the second long-chain fatty acid ester layer to form second light emitting patterns;
      coating a third long-chain fatty acid ester layer on the pixel spacing area, the first light emitting patterns, and the second light emitting patterns;
      coating a third light emitting layer on the third sub-pixel areas and the third long-chain fatty acid ester layer;
      ashing the first substrate, and removing the third long-chain fatty acid ester layer to form third light emitting patterns; and
      forming a cathode.

* * * * *